(12) United States Patent
Komatsu

(10) Patent No.: US 9,956,610 B2
(45) Date of Patent: May 1, 2018

(54) OXYGEN SOURCE-CONTAINING COMPOSITE NANOMETAL PASTE AND JOINING METHOD

(71) Applicants: APPLIED NANOPARTICLE LABORATORY CORPORATION, Osaka-shi (JP); NIHON SUPERIOR CO., LTD., Suita-shi (JP)

(72) Inventor: Teruo Komatsu, Osaka (JP)

(73) Assignees: Applied Nanoparticle Laboratory Corporation (JP); Nihon Superior Co., Ltd. (JP)

(*) Notice: Subject to any disclaimer, the term of this patent is extended or adjusted under 35 U.S.C. 154(b) by 872 days.

(21) Appl. No.: 14/379,719

(22) PCT Filed: Feb. 20, 2013

(86) PCT No.: PCT/JP2013/054239
§ 371 (c)(1),
(2) Date: Aug. 19, 2014

(87) PCT Pub. No.: WO2013/125604
PCT Pub. Date: Aug. 29, 2013

(65) Prior Publication Data
US 2015/0037197 A1 Feb. 5, 2015

(30) Foreign Application Priority Data
Feb. 20, 2012 (JP) .................. 2012-034349

(51) Int. Cl.
*B22F 1/00* (2006.01)
*B23K 35/30* (2006.01)
(Continued)

(52) U.S. Cl.
CPC .......... *B22F 1/0062* (2013.01); *B22F 1/0018* (2013.01); *B22F 3/1021* (2013.01);
(Continued)

(58) Field of Classification Search
CPC combination set(s) only.
See application file for complete search history.

(56) References Cited

U.S. PATENT DOCUMENTS

2008/0160183 A1* 7/2008 Ide .................. H01B 1/02
427/126.5

FOREIGN PATENT DOCUMENTS

JP  10-183207   7/1998
JP  11-3617     1/1999
(Continued)

OTHER PUBLICATIONS

"Bonding Process Using Composite Ag Nanoparticle," by Akio Hirose, et al. in Journal of Japan Institute of Electronics Packaging, Nov. 1, 2006, vol. 9, No. 7, p. 528-532.
(Continued)

*Primary Examiner* — Colleen P Dunn
*Assistant Examiner* — Anthony M Liang
(74) *Attorney, Agent, or Firm* — DLA Piper LLP (US)

(57) ABSTRACT

An oxygen source-containing composite nanometal paste including at least composite nanometal particles, in which an organic coating layer is formed around a submicron or smaller silver core, and an oxygen source, which feeds oxygen contributing to pyrolysis at a pyrolysis temperature range in which the organic coating layer is pyrolyzed. The oxygen source comprises an oxygen-containing metal compound, and the oxygen content of the oxygen source is within a range of 0.01 mass % to 2 mass % per 100 mass % of the composite nanometal particles.

7 Claims, 7 Drawing Sheets

(51) Int. Cl.
*B23K 35/34* (2006.01)
*H01L 23/00* (2006.01)
*B22F 3/10* (2006.01)
*B23K 35/00* (2006.01)
*C22C 5/06* (2006.01)
*C22C 9/00* (2006.01)
*B23K 35/36* (2006.01)
*B23K 35/02* (2006.01)
*B82Y 30/00* (2011.01)
*B22F 3/14* (2006.01)
*C09J 9/02* (2006.01)

(52) U.S. Cl.
CPC ............ *B22F 3/14* (2013.01); *B23K 35/00* (2013.01); *B23K 35/025* (2013.01); *B23K 35/3006* (2013.01); *B23K 35/34* (2013.01); *B23K 35/3618* (2013.01); *B82Y 30/00* (2013.01); *C09J 9/02* (2013.01); *C22C 5/06* (2013.01); *C22C 9/00* (2013.01); *H01L 24/29* (2013.01); *H01L 24/83* (2013.01); *B22F 2304/05* (2013.01); *H01L 2224/2949* (2013.01); *H01L 2224/29294* (2013.01); *H01L 2224/29339* (2013.01); *H01L 2224/29347* (2013.01); *H01L 2224/29499* (2013.01); *H01L 2224/83* (2013.01); *H01L 2224/8384* (2013.01)

(56) References Cited

FOREIGN PATENT DOCUMENTS

| | | |
|---|---|---|
| JP | P3630920 | 3/2005 |
| JP | P3690552 | 8/2005 |
| JP | P2007-42301 A | 2/2007 |
| JP | P2007-204778 A | 8/2007 |
| JP | P2008-166086 A | 7/2008 |
| WO | WO2009/090846 | 5/2011 |

OTHER PUBLICATIONS

"Silver nanosintering: a lead-free alternative to . . . " by Minoru Maruyama, et al. in Applied Physics A of Material Science & Processing of Springer-Verlag in 2008, p. 467-470.

* cited by examiner (1A)

(1B)

OXYGEN SOURCE-CONTAINING COMPOSITE NANOMETAL PASTE AND JOINING METHOD

FIELD OF THE INVENTION

The present invention relates to a nanometal paste including nanometal particles, and particularly to a composite nanometal paste including composite nanometal particles in which an organic coating layer is formed around a metal core.

BACKGROUND ART

As a metal paste for joining or forming metal patterns, there has been developed a composite nanometal paste including composite nanometal particles in which an organic coating layer is formed around a metal core less than or equal to 100 nm. For example, in the embodiment 1 of Japanese Patent Laid-Open No. H10-183207 (patent document 1), it is described the ultra-fine particle in which an organic coating layer of stearic acid group is formed around a silver-metal core. In WO2009/090846 bulletin (patent document 2), the composite nanosilver particles in which an organic coating layer such as alcohol molecule and alcohol derivative is formed around a silver-metal core are disclosed. Furthermore, in the patent document 1 and the patent document 2, it is described that the composite nanometal particles are used for the metal paste. The nanometal particle less than or equal to 100 nm is unstable, because its surface is large, so that the protective layer such as the organic coating layer is needed to exist stably as mentioned above.

In the nanometal particles smaller than or equal to 100 nm, since the melting point is depressed with decreasing of the grain size, the metal paste containing the composite nanometal particles can be sintered at a relatively low temperature, and then it is expected that the composite nanometal paste having the higher joining strength and the preferable electric conductivity is developed.

However, when the metal paste containing the organic coating layer of the metal particle, solvent and so on is sintered by heating, the joining strength and the electric conductivity after sintering are dependent on a ratio of the metal component and organic component in the paste, so that it is demanded that the coating organic component is discharged more efficiently by pyrolysis at the sintering temperature.

In the patent bulletin of JP3630920 (patent document 3), there is described the sintering method of the metal paste that the metal paste in which metal microparticles are dispersed in the organic solvent is preliminarily sintered in an ozone atmosphere under pressure reduction, and the metal paste is really sintered after resolution and removal of the organic solvent. Namely, it is described that the oxygen content adjusted to the predetermined quantity is supplied from outside in order to pyrolyze organic matter contained in the metal paste. Similarly, in the patent bulletin of JP3630552 (patent document 4), it is described the sintering method of the metal paste that the metal paste in which metal microparticles are dispersed in the organic solvent is preliminarily sintered under pressure reduction and the condition that oxygen radical exists, and the metal paste is really sintered in the reducing atmosphere.

In the claim 1 of Japanese Patent Laid-Open No. H11-3617 bulletin (patent document 5), it is described that "a thick-film gold paste which can be sintered under nitrogen atmosphere is characterized by including of a fine powder of gold, a resin for paste adjustment, vehicle and an oxide having a property releasing oxygen", and in the claim 9 and paragraph 0018 of the document, it is described that the thick-film gold paste is sintered at 500 to 1000° C. under nitrogen atmosphere. Furthermore, in paragraph 0017 of the patent document 5, it is described that "when it is added by small quantity the oxide that is exposed at high temperature under nitrogen atmosphere so that the oxygen is released, it is discovered that a smooth combustion is caused by the released oxygen which assists the oxidation of the resin ingredient". In paragraph 0014 of the patent document 5, it is described that said thick-film gold paste contains the resin for paste adjustment such as ethyl cellulose, so that "it is verified that a small amount of the resin disappears by exposure at a high temperature not less than 600° C. Namely, in the patent document 5, it is described that when the thick-film gold paste is sintered at 600° C. or higher under the nitrogen atmosphere, the oxide releases the oxygen, which promotes the combustion by assisting oxidation of a resin ingredient for paste adjustment.

In M. Maruyama, et al, "Silver nanosintering: a lead-free alternative to soldering" Appl. Phys. A 93 (2008) 467-470 (non-patent document 1) including the present inventor as one of collaborators, the desorption-resolution process of the organic coating-layer is described in the case using the composite nanometal particle in which an organic coating layer is formed. In the non-patent document 1, it is described that as for sintering in the inert gas, the disappearance of the organic coating layer in the composite nonmetal particle is not the oxidation process in the pyrolysis but the desorption process from a bonding state due to thermal energy. The desorption process of the organic coating layer in the composite nanometal particle under inert gas is kept in slow to a high temperature region in comparison with sintering under the atmosphere, and the temperature threshold at which the organic matter is completely desorbed shifts to the high temperature side more than 70° C.

[Patent Document 1] Japanese Patent Laid-Open No. H10-183207
[Patent Document 2] WO2009/090846
[Patent Document 3] Japanese patent No. 3630920
[Patent Document 4] Japanese patent No. 3690552
[Patent Document 5] Japanese Patent Laid-Open No. H11-3617
[Non-Patent Document 1] M. Maruyama, et al, "Silver nanosintering: a lead-free alternative to soldering" Appl. Phys. A 93 (2008) 467-470

DISCLOSURE OF THE INVENTION

Problems to be Solved by the Invention

In the composite nanometal particle described in the patent documents 1 and 2, since the organic coating layer which comprises organic matter is formed around metal core, the conventional composite nanometal paste including the composite nanometal particles does not avoid the containing of the organic ingredient due to the coating as well as the organic ingredient due to the paste composition. Furthermore, it is demanded that the organic coating layer is pyrolyzed more effectively and released. In particular, in the case that the metal paste for joining is applied between the members to be joined and they are sintered, it becomes more important that the organic coating layer is removed effectively.

Accordingly, because of containing additively the organic matter ingredient such as solvent, pyrolyzing the organic coating layer at a decomposition temperature higher than the predetermined value and aggregating or sintering the metal cores, it is difficult that the organic matter ingredient of the composite nanometal paste is removed with high efficiency, so that the decrease of the joining strength and the electric conductivity is caused with increase of the joining area.

As described in the patent documents 3 and 4, in the joining using the composite nanometal paste, since a contact area with the atmosphere is small under ozone or oxygen radical atmosphere, it is difficult to remove the organic matter ingredient effectively. Furthermore, in a case that the composite nanometal paste is set under the ozone or oxygen radical atmosphere, the running cost in the sintering process of the composite nanometal paste increases. In particular, the organic coating layer of the composite nanometal particle is formed around the metal core, so that even if the ozone or the oxygen radical is supplied from the outside, it is extremely difficult to contribute to the pyrolysis of the organic coating layer. Especially, the method as described in the patent documents 3 and 4 could not be used as an effective joining method of the electrode formation in semiconductor elements.

In the patent document 5, it is described that the thick-film gold paste which is sintered at 500 to 1000° C. under the nitrogen atmosphere contains the resin for adjusting paste such as ethyl cellulose and the oxide releasing the oxygen which is used in the combustion of the resin for adjusting paste. However, in the embodiment described in the patent document 5, the sintering under the nitrogen atmosphere is more than 600° C., and the oxygen released from the oxide contributes to the combustion of the resin for adjusting paste. Namely, in the joining using the composite nanometal paste which contains the composite nanometal particle having the organic coating layer, when the oxygen is not supplied enough, and the sinter is carried out at relatively low temperature, the means promoting the pyrolysis of the organic coating layer is not disclosed. The composite nanometal particle is characterized in that it is possible to be sintered at relatively low temperature less than 500° C., and it is demanded the method that the organic coating layer is effectively pyrolyzed in the sinter of low temperature.

Furthermore, in the non-patent document 1, it is described that as for sintering in the inert gas, the disappearance of the organic coating layer in the composite nanometal particle is not the oxidation process in the pyrolysis but the desorption process from a bonding state due to thermal energy. In the semiconductor joining process including the copper electrode frames that the oxidation is unfavorable, the joining is usually carried out in the inert gas. When the composite nanometal paste which contains the organic coating layer is used as the paste for joining in the inert gas, the treatment at temperature higher than the heat-treatment process in the atmosphere is not only needed but the problem that the electrode surface is contaminated also is occurred because the desorbed substance which has the active reaction group arises in the heat desorption process of the organic coating layer and causes the re-reaction and the combination on a surface of electrode material. In particular, when the pressurization joining is carried out, there is a greater problem that the large quantity of the desorbed substance having the active reaction group arises in a short time.

Accordingly, the object of the present invention is to remove the organic coating layer of the composite nanometal particle due to the pyrolysis of the higher efficiency in the use for joining and the sintering under the inert gas, so that the joining strength and the electric conductivity of the composite nanometal paste are improved.

Means to Solve the Problems

The present invention has been completed to solve the above problem, and the first form of the present invention is an oxygen source-containing composite nanometal paste comprising at least composite nanometal particles in which an organic coating layer is formed around a submicron or smaller silver core, and an oxygen source for feeding oxygen contributing to pyrolysis at a pyrolysis temperature range in which said organic coating layer is pyrolyzed, wherein said oxygen source comprises an oxygen-containing metal compound, and the oxygen content of said oxygen source exists within a range of 0.01 mass % to 2 mass % per 100 mass % of said composite nanometal particles, and the second form of the present invention is an oxygen source-containing composite nanometal paste in which said oxygen source comprises a surface oxidation layer which is formed on a surface of said copper particle, and the oxygen content of said oxygen source exists within a range of 0.02 mass % to 2 mass % per 100 mass % of said composite nanometal particles. Furthermore, as a joining method using the oxygen source-containing composite nanometal paste concerning the present invention, the joining method comprises the steps of setting a sintering temperature higher than said pyrolysis temperature range of said organic coating layer, and heating to said sintering temperature, wherein a pressurization is carried out by applying a setting pressure during a timing that the temperature reaches within said pyrolysis temperature range, so that the method is the joining method in which a hard and certain joining state is obtained by the optimum pressurization timing applying the setting pressure at the optimum timing.

Effects of the Invention

According to the first form of the present invention, because of comprising at least the composite nanometal particles in which the organic coating layer is formed around the submicron or smaller silver core and the oxygen source for feeding oxygen contributing to the pyrolysis in the pyrolysis temperature range in which said organic coating layer is pyrolyzed, the organic coating layer can be removed due to the pyrolysis of the high efficiency in the pyrolysis temperature range. Namely, when the organic matter forming the organic coating layer is pyrolyzed, the oxygen is supplied positively, so that the organic matter can be removed by the release due to the oxidation and the combustion. The oxygen source comprises the oxygen-containing metal compound, and in order to preferably perform the pyrolysis and not to release the excess oxygen, the oxygen content of said oxygen source is set in the range of 0.01 mass % to 2 mass % per said composite nanometal particle of 100 mass %. Therefore, a preferred ratio of the metal ingredient is kept in the composite nanometal paste for the joining. In other words, an optimum ratio of the containing metal ingredient is held in the joining material formed by sintering the composite nanometal paste and the electrode patterns sintered under the inert gas, and the sintering is carried out without adding other ingredient such as conductive resins. After contributing to the pyrolysis of the organic coating layer due to the supply of the oxygen, the oxygen-containing metal compound becomes a metal, which can contribute as the metal ingredient in the composite nanometal paste, so that high strength and high electrical conductivity are given. In particular, the organic matter and the oxide do not remain under the sintering condition higher than the setting temperature. In the case that the composite nanometal paste is used for joining between joined members, the oxygen in the atmosphere is almost not used for sintering, and since the oxygen source is contained in the composite nanometal paste, the organic coating layer can be pyrolyzed more effectively.

Furthermore, according to the first form of the present invention, even in the case of sintering under the inert gas, since the oxygen source is contained in the composite nanometal paste, said organic coating layer is pyrolyzed more effectively due to the supply of the oxygen from the oxygen-containing metal compound, in addition, the metal ingredient remains in the preferred ratio so that the high electrical conductivity can be given to bond region after sintering, and since the oxygen supply metal compound as an oxygen source forms the joint portion as the aggregate, the joining strength improves in comparison with the conventional nanometal paste formed only by the nanoparticle such as the composite nanometal particle. Therefore, according to the first form of the present invention, as the oxygen source is formed by said oxygen-containing metal compound, in said composite nanometal paste the metal ingredient of the composite nanometal particle and the oxygen-containing metal compound is added at the time of the sintering, so that the rigid joining strength and satisfactory electrical conductivity can be realized on the basis of the high content of the metal ingredient in the joint portion. Furthermore, as the metal ingredient, the metal filler comprising silver particles and/or copper particles may be added to the composite nanometal particle and the oxygen-containing metal compound, and the metal filler ranging from submicron to several ten micrometer may be contained, specifically 0.1 μm to 10 μm is preferred, and 0.1 μm to 10 μm is more preferred.

According to the second form of the present invention, there are comprised at least the composite nanometal particles in which the organic coating layer is formed around the submicron or smaller silver core, the metal filler such as the copper particle and the oxygen source for feeding oxygen contributing to said pyrolysis at the pyrolysis temperature range in which said organic coating layer is pyrolyzed, and since said oxygen source comprises the surface oxidation layer which is formed on the surface of said copper particle, the quantity of the surface oxidation is extremely small or little in the copper particles after releasing the oxygen from said surface oxidation layer, so that the copper particles can function as the preferable copper filler and said organic coating layer can be pyrolyzed with high efficiency due to the released oxygen. Furthermore, in order to perform the preferable pyrolysis and not to release the excessive oxygen, the mass of the oxygen ingredient contained in said oxygen source is set within the range of 0.02 mass % to 2 mass % per said composite nanometal particle of 100 mass %. Namely, the oxygen is released from said surface oxidation layer in the preferable range, so that the preferred ratio of metal ingredient can be held in the composite nanometal paste. In other words, the copper particle of which the oxygen is released from the surface oxidation layer can form the joining material after sintering as the copper filler ingredient.

According to the third form of the present invention, since the oxygen source supplies the oxygen in the range of 160° C. to 300° C., the oxygen source can supply the oxygen contributing to the pyrolysis in high efficiency. When said composite nanometal paste containing the oxygen source includes a viscosity grant agent, for example, in the condition of atmospheric thermogravimetry measurement (TG) in which the temperature raises within the range of 1 to 5° C./min, it is preferable that the oxygen is supplied at the temperature higher than the disappearance temperature of the viscosity grant agent of which the content mass ratio almostly disappears. Namely, in the composite nanometal paste for joining concerning the present invention, the disappearance temperature of the viscosity grant agent is defined as the temperature at which the content mass ratio of the viscosity grant agent almostly disappears in the atmospheric thermogravimetry measurement (TG), so that the oxygen released from said oxygen source can be contributed to the pyrolysis of said organic coating layer in high efficiency at the temperature higher than the disappearance temperature of the viscosity grant agent. Since it is necessary that the disappearance temperature of the viscosity grant agent is lower than the pyrolysis temperature of the organic coating layer, in the case that said organic coating layer is pyrolyzed at the higher temperature than 160° C., it is preferable that the disappearance temperature of the viscosity grant agent is lower than 160° C. and it is more preferable to be lower than 150° C.

The viscosity grant agent such as isobornyl cyclohexanol can be used, and when a viscosity adjustment solvent is added, alcohol etc. can be used. Since the viscosity adjustment solvent is added in addition to the viscosity grant agent, it is possible to be used due to adjusting the viscosity to the range of 1 Pa·s to 500 Pa·s. For example, it is preferable that the paste for joining is 50 Pa·s to 200 Pa·s.

According to the fourth form of the present invention, since said organic coating layer comprises one or more members selected from an alcohol, an alcohol derivative and an carboxylic acid, the composite nanometal particle can be produced more easily, so that the production efficiency of said composite nanometal paste containing the oxygen source can be improved. For example, in the patent document 2, it is described that the composite nanometal particle is obtained due to the reaction between the alcohol and the metal compound, and the reducing agent is not needed in particular. In addition, the carboxylic acid is generated from the alcohol derivative, so that the organic coating layer can be formed. Furthermore, the carbon number of the organic coating layer depends upon the carbon number of an organic matter molecule such as alcohol used for raw materials, and the carbon number can be chosen from the range of 1 to 12. Therefore, the carbon number of the organic matter formed around the metal core of the composite nanometal particle can be adjusted. The pyrolysis temperature of the organic coating layer tends to arise with increase of the carbon number in the organic matter, and if the pyrolysis temperature is adjusted on the basis of the temperature range supplying oxygen in said oxygen source, it is possible to pyrolyze the organic coating layer in higher efficiency. Furthermore, when two or more kinds of organic matters of which their carbon numbers are different is formed around one metal core as the organic coating layer, the temperature range until the perfect pyrolysis spreads, so that it is possible to sinter relatively slowly the metal core and the metal ingredient of the oxygen-containing metal compound and corresponding to their temperature ranges supplying oxygen.

According to the fifth form of the present invention, since said oxygen-containing metal compound comprises one or more members selected from a silver carbonate, a silver peroxide and a copper suboxide, in the case raising the temperature to the pyrolysis temperature of the organic coating layer, the oxygen is supplied more surely and the extremely high ratio of the metal ingredient such as silver and copper can be held, so that it is possible to be sintered with the composite nanometal paste. Since the silver and the copper have high thermal conductivity and electrical conductivity, desired electrical and thermal characteristics can be given to the sintered body of the composite nanometal paste. In the case that the oxygen-containing metal compound is the silver carbonate, the oxygen of the carbonic acid ingredient is used in the pyrolysis of said organic coating layer and the metal ingredient comprising the silver can be remained, and the carbon can be released as the carbon dioxide. Since the silver has high thermal and electrical conductivities, desired electrical and thermal characteristics are given to the sintered body of the composite nanometal paste. Not only the silvers but also the silver and the copper have preferable affinity each other, so that it is possible to give preferable bondability.

It is preferable that the silver carbonate is dispersed in the composite nanometal paste as silver carbonate particles which have a average particle diameter of several ten nanometers, and especially, it is preferable that the silver carbonate particles of which the average particle diameter is 50 nm or smaller are dispersed as the oxygen source.

According to the sixth form of the present invention, said oxygen source contains a composite body that a periphery of said oxygen-containing metal compound is coated by said composite nanometal particles, and since said composite body feeds said oxygen within said pyrolysis temperature range, said organic coating layer can be pyrolyzed in high efficiency. In the composite body, there are started the pyrolysis of said organic coating layer forming the composite nanometal particle and the desorption of the composite nanometal particle, and since the oxygen-containing metal compound which is coated by the composite nanometal particles supplies the oxygen in the pyrolysis temperature range of said organic coating layer, the pyrolysis of said organic coating layer is performed in higher efficiency. At the same time, since the metal ingredient contained in the oxygen-containing metal compound remains, the metal ingredient has the preferable ratio, so that high strength and high electrical conductivity are given to the sintered body of the composite nanometal paste containing said oxygen source of the present invention.

According to the seventh form of the present invention, in a joining method using the composite nanometal paste containing the oxygen source according to any one of the first to sixth forms, when there is performed the joining process comprising the steps of setting a sintering temperature higher than said pyrolysis temperature range of said organic coating layer and heating to said sintering temperature, the setting pressure is applied during a timing that the temperature reaches within said pyrolysis temperature range, so that it is realized the joining method which can obtain the certain joining state in rigid. Therefore, as the composite nanometal particle is pressurized in the timing that the organic coating layer of the composite nanometal particle is pyrolyzed and sintered, it is possible to join the object to be joined with preferable strength.

BEST MODE FOR CARRYING OUT THE INVENTION

In the thermal analysis data (TG/DTA) during the sintering process under atmosphere of the composite nanometal paste, the viscosity adjustment solvent and the viscosity grant agent firstly evaporate and the organic coating layer of the composite nanometal particle is secondly pyrolyzed, so that the structure of decrease steps appear sequentially in the thermogravimetry spectrum (TG). In the differential thermal analysis spectrum (DTA) corresponding to the TG spectrum, its value becomes negative in the endotherm process by the evaporation, but its value becomes positive in the exothermic process by the oxidation, so that the large peak appears in proportional to the quantity of oxidation.

On the other hand, as described in the non-patent document 1, the sinter of organic coating layer under the inert gas is not oxidation process but desorption process from bonding state by thermal energy, which continues slowly to the high temperature region, so that the temperature threshold that the organic matter desorbs perfectly shifts to the high temperature side by more than 70° C.

Therefore, in the joining process of semiconductor etc. including the copper electrode frame that the oxidation is unfavorable, the joining is usually done under inert gas. However, when the organic nanometal paste is used as joining paste, it is not only necessary to be treated at higher temperature than the heat treatment process under atmosphere but there is also caused a problem that the electrode surface is polluted because the desorbed substance which has the active reaction group generated in the desorption process of the organic coating material causes re-reaction and bonding on the surface of electrode material. When the pressurized joining is performed, the desorption material having a large quantity of active reaction group occurs in a short time and such a phenomenon becomes a large problem still more, so that the present invention has been developed. As follows, the embodiments of the present invention are described in details by using of the drawings.

For the organic matter forming the organic coating layer of composite nanometal particle concerning the present invention, it is possible to use carboxylic acid function, alkoxide, other alcohol derivatives and amide group. Especially, carboxylic acid, alkoxide and other alcohol derivatives can be comparatively easily produced, and when alcohol solvent and metal compound are reacted, a reducing agent is unnecessary because alcohol in itself has the reduction function, so that the manufacturing process can be simplified. Furthermore, in the case that the organic coating layer is formed by carboxylic acid, alkoxide and other alcohol derivatives, they are resolved to carbon dioxide when the organic matter is pyrolyzed, so that it is possible to sinter remaining the metal ingredient more perfectly.

Figure 1:
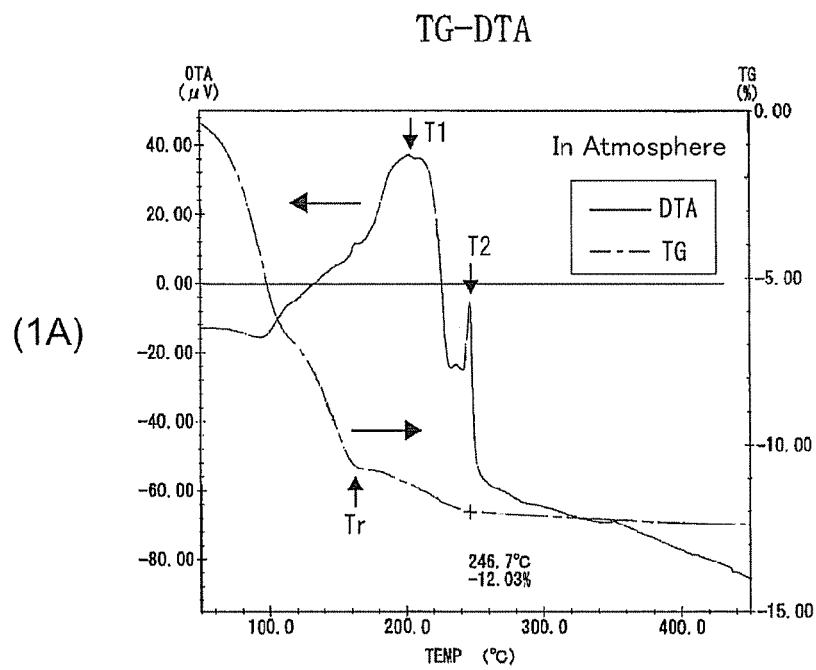
FIG. 1 is a graph diagram showing the thermal analysis spectrum in which the thermal analysis of the composite nanosilver paste concerning the present invention is performed in the atmosphere and the high purity nitrogen gas.
Figure 1:
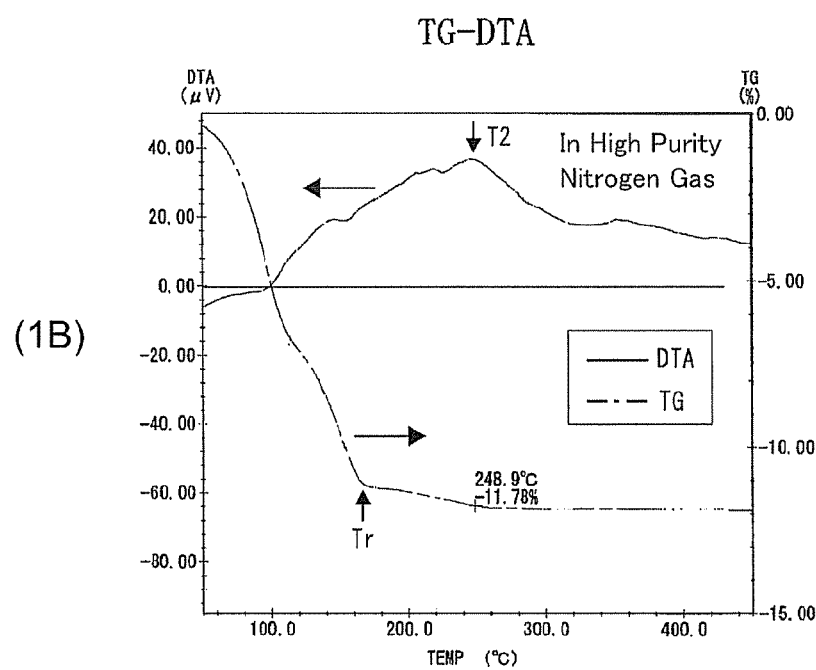
Figure 2:
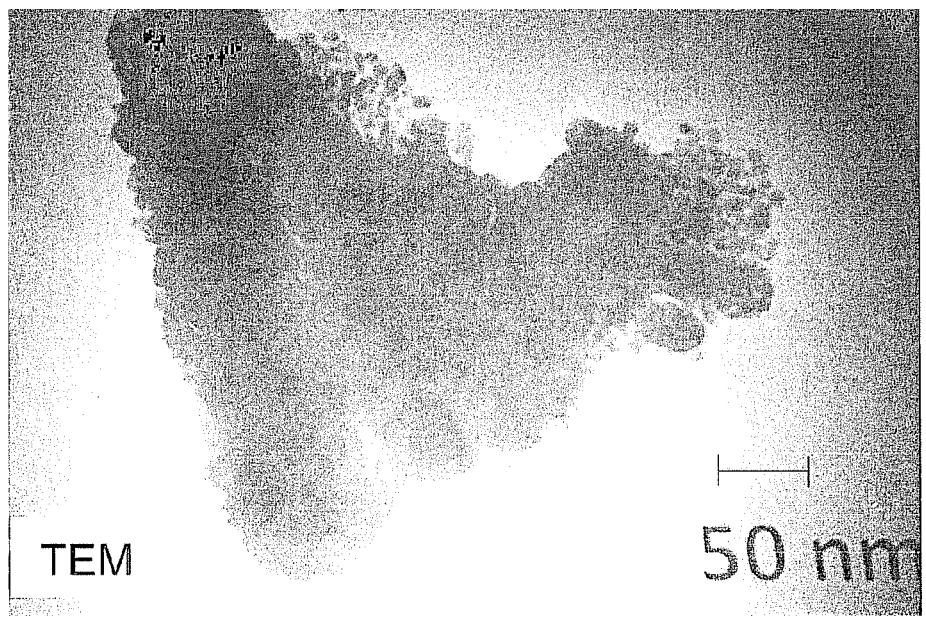
FIG. 2 is a photograph diagram of the scanning electron microscope image (TEM) for the composite structure that the composite nanosilver particles concerning the present invention surround around silver carbonate.

FIG. 1 is the graph diagram showing the thermal analysis spectrum in which the thermal analysis of composite nanosilver paste concerning the present invention is performed in the atmosphere (1A) and the high purity nitrogen gas (1B). (1A) of FIG. 1 shows the thermal analysis spectrum (TG-DTA) of the composition nanosilver paste in which the oxygen source is contained by mixing and dispersing, where the paste contains the particles of the composite structure that the composite silver nanoparticle surrounds around the silver carbonate, and the particles of 10% is contained in the paste that the composite silver nanoparticles are obtained by the reaction of silver carbonate in hexanol. The measured compound nanosilver paste includes the composite nanosilver particle, the oxygen source, the viscosity grant agent and the viscosity adjustment agent. Measurement conditions are set in the supply of dry air at 100 mL/min and the temperature rising rate of 5° C./min. In FIG. 2, it is shown the transmission electron microscope image (TEM) of the composite body structure that the composite nanosilver particle surrounded around the silver carbonate, and the details are described below. This composite body is contained as an oxygen source. TG (chain lines) and DTA (solid lines) spectra indicate same characteristics described above, and in the DTA spectrum, the large peak of positive value appears in the resolution temperature region shown by T1 because of the exothermic process due to the oxidation, so that it is found that the organic coating layer is resolved by the oxidation. Furthermore, in the TG spectrum, the sintering completes at the resolution temperature region indicated by T2 of the DTA spectrum, and then the predetermined mass ratio becomes the constant value because of comprising almost the metal ingredient, so that it is found that the sintering temperature is about 247° C. as shown in the figure. In addition, the temperatures Tr which are shown in the TG spectra of (1A) and (1B) indicate the temperatures at which most of the viscosity grant agent disappears after the viscosity adjustment agent is evaporated, and the temperature Tr exists at inflection point in the TG spectrum. In the temperature higher than Tr, the pyrolysis of the organic coating layer causes principally the decrease of TG spectrum.

Furthermore, in the TG spectrum of (1A), the mass about 12% decreases, so that it is indicated that the ingredient about 12% except the metal ingredient is contained in the compound nanosilver paste shown at (1A) of FIG. 1.

(1B) of FIG. 1 is a graph diagram showing the thermal analysis spectrum in which the thermal analysis of the compound nanosilver paste in (1A) is performed under the high purity nitrogen gas. (1B) is the thermal analysis spectrum of the same paste which is used in the thermal analysis shown in (1A), and the measurement is performed in the conditions that the high purity nitrogen gas is supplyed at 100 mL/min and the temperature rising rate is 5° C./min. However, because of difference from the conventional composite nanometal paste which does not contain an oxygen source, the DTA spectrum has the peak which indicates comparable exothermic at the resolution temperature, so that it is found that the organic matter forming the organic coating layer is oxidize and pyrolyzed. Namely, even in the high purity nitrogen gas, said composite body containing the silver carbonate becomes the oxygen source, and then the organic coating layer is resolved due to the oxidation. In the TG spectrum, the threshold temperature of step showing the sintering end is near to the temperature of sintering process under the atmosphere and is higher than 249° C. by several degrees, but it is ensured that the effect of oxygen source addition is effective. As described above, in the conventional composite nanometal paste, since the oxygen is not supplied in the sintering under the nitrogen atmosphere, the temperature threshold at which the organic matter is perfectly emitted shifts largely to the higher temperature side in comparison with the sintering under the atmosphere. However, in the composite nanometal paste containing the oxygen source concerning the present invention, the organic coating layer can be pyrolyzed even in the nitrogen atmosphere as well as the sintering under the atmosphere, and then in the cases of the sintering under inert gas and pressure, the generating resolution gas is a little because of passing through the oxidation process, so that the action polluting electrode metal also can decreases.

Furthermore, other preferred effects of the oxygen source addition is the decreasing of sintering temperature and the increasing of joining strength, so that the sintering is usually performed at 300° C. but it is possible to sinter at 250° C., and in the case of the copper test piece which has the joining area of 10 mm φ, the joining strength under pressure condition of 40 MPa is 40 MPa as well as the sintering at 350° C.

FIG. 2 is the photograph diagram of the transmission electron microscope image (TEM) as to the structure of composite body that the periphery of the oxygen-containing metal compound is surrounded by the composite nanometal particles concerning the present invention. As described in the explanation of FIG. 1, as the oxygen source, there is used the composite body in which the periphery of the silver carbonate crystallization or aggregate is coated by the composite nanosilver particles. In the TEM image, it is observed that the composite nanosilver particles in which the organic coating layer is formed around metal core surround the aggregate of silver carbonates and the silver carbonate crystallization or aggregate is coated by the composite nanosilver particles. The composite nanosilver particle coating the silver carbonate is named merely composite body, as described above, the composite body is the silver carbonate, so that the function as oxygen source as well as silver oxide is given.

TABLE 1

Oxygen Supplying Temperature of Oxygen-Containing Metal Compound

| Example of Oxygen Source | Oxygen Supplying Temperature Range (Sintering in Gas) | Oxygen Supplying Temperature Range* (Sintering of Paste Coexisting with Alcohol in Inert Gas) |
|---|---|---|
| Silver Oxide ($Ag_2O$) | 390-400° C. (in Atmosphere) | 70-140° C. (Addition of 10 mass %) |
| Silver Peroxide ($Ag_2O_2$) | 180-200° C., 380-400° C. (in Atmosphere) | 90-140° C. (Addition of 10 mass %) |

TABLE 1-continued

Oxygen Supplying Temperature of Oxygen-Containing Metal Compound

| Example of Oxygen Source | Oxygen Supplying Temperature Range (Sintering in Gas) | Oxygen Supplying Temperature Range* (Sintering of Paste Coexisting with Alcohol in Inert Gas) |
|---|---|---|
| Silver Peroxide ($Ag_2O_3$) | 180-200° C., 330-390° C. (in Atmosphere) | 90-140° C. (Addition of 10 mass %) |
| Copper Suboxide ($Cu_2O$) | 100-200° C. (in Atmosphere) | 100-250° C. (Addition of 10 mass %) |
| Silver Carbonate ($Ag_2CO_3$) | 330-390° C. (in Atmosphere) | 150-270° C. (Addition of 10 mass %) |
| Oxygen-Containing Metal Compound Coated by Composite Silver Nanoparticle | 120-160° C. (in Atmosphere) | 140-260° C. (Addition of 10 mass %) |
| Copper Filler Containig Oxygen | 50-200° C. (in Inert Gas) | 120-280° C. (Addition of 10-75 mass %) |

*In the temperature range, DTA specrtrum is positive and become larger than value before addition.

In the Table 1, it is shown the oxygen supplying temperature range of the oxygen containing metal compound which can become the oxygen source. In the oxygen containing metal compound such as the metallic oxide, the metal salt containing oxygen, the oxygen-containing metal compound coated by the composite nanosilver particles (also called "composite body") and the surface oxidation metal particle, the temperature range releasing their oxygen becomes important for the pyrolysis process of the coating layer in the nanoparticle. In Table 1, it is shown the oxygen supplying temperature range in which each oxygen source can supply the oxygen under conditions of "Sintering in Gas" and "Sintering of Paste Coexisting with Alcohol coexistent in Inert Gas". The words "Sintering in Gas" indicate sintering each oxygen source in the atmosphere or the inert gas, and the words "Sintering of Paste Coexisting with Alcohol in Inert Gas" indicate the oxygen supplying temperature range under coexistence of the alcohol used as the viscosity adjustment agent.

As shown in Table 1, the oxygen releasing of metallic oxide is caused at a little higher temperature side under the atmosphere but in the coexistence with alcohol such as the viscosity adjustment solvent contained in the paste, the oxygen releasing shifts to lower temperature side, so that the oxygen supplying temperature range releasing the oxygen changes due to the reduction effect of the coexisting material. Therefore, it is preferable that the oxygen supplying temperature of the paste is examined about whether the oxygen is released preferably at the pyrolysis temperature range of the organic coating layer in the composite nanometal paste.

Furthermore, in the silver carbonate as example of the oxygen-containing metal compound, the oxygen releasing is caused after the releasing of carbon dioxide, and since they become the silver oxide $Ag_2O$, it is considered that they have substantially the same function as the oxygen-containing metal compound. However, as explained below, when the silver oxide $Ag_2O$ is contained as the oxygen source, the result that the exothermic is caused due to the oxidation is obtained at the temperature higher than the pyrolysis temperature range in the TG·DTA spectra. Namely, all of the oxygen-containing metal compounds which can release the oxygen in the pyrolysis temperature range does not usually become the oxygen source, so that it is preferred that a particular oxygen-containing metal compound is selected according to the sintering conditions.

As an example of the composite silver nanoparticle coating the oxygen-containing metal compound (composite body), the structure in which the compound nanosilver particles surrounds the periphery of silver carbonate is obtained as an intermediate product of nanoparticle reaction as shown in the FIG. 2, but the temperature range in which its particle is pyrolyzed becomes the same as the composite nanometal particle, so that in the process that the composite nanometal particle is pyrolyzed and in the temperature range that the coating is resolved, the oxygen is immediately released at the same time, and then it is possible to become the oxygen source.

When copper particles in which the copper suboxide $Cu_2O$ is formed are used as an example of the surface oxidation metal particle, in the temperature range higher than 250° C., the range becomes a oxidation range due to being a oxygen absorption source, but it is found that it is possible to become the oxygen source in the wide temperature range because the bonding oxygen of the copper suboxide is released gradually by the thermal dissociation in the temperature range to 200° C.

Figure 3:
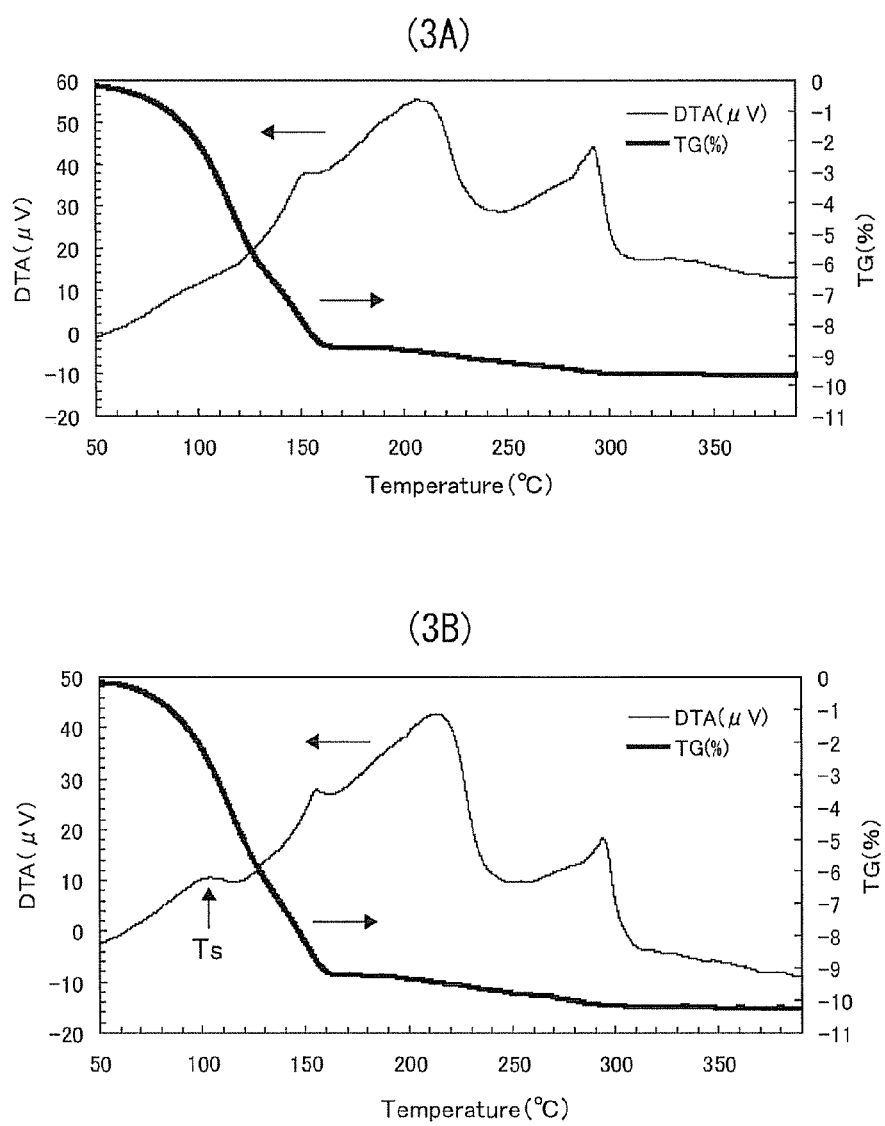
FIG. 3 is a graph diagram showing TG·DTA spectra for an example (3A) including silver peroxide ($Ag_2O_2$) and a comparative example (3B) including silver oxide ($Ag_2O$) as the oxygen source concerning the present invention.

FIG. 3 is the graph diagram showing TG and DTA spectra of the embodiment (3A) containing the silver peroxide ($Ag_2O_2$) as the oxygen source concerning the present invention and the comparative example (3B) containing the silver oxide ($Ag_2O$). In the embodiment shown in (3A), the silver peroxide ($Ag_2O_2$) as the oxygen source is contained with the viscosity grant agent and the viscosity adjustment solvent in addition to the composite nanosilver particle. In the DTA spectrum (thin line) of (3A), the values of DTA increase gently to near 150° C. at which the viscosity grant agent and the viscosity adjustment solvent disappear, so that it is indicated that the exothermic reaction is not remarkable by comparison. On the other hand, in the case that the silver oxide ($Ag_2O$) is contained in the comparative example of (3B), there is a peak shown by Ts, and before most of the viscosity grant agent and the viscosity adjustment solvents disappear, the silver oxide ($Ag_2O$) releases the oxygen, so that the exothermic peak appears due to the oxidation. Therefore, in the result of embodiment shown in FIG. 3, it is shown that the silver peroxide ($Ag_2O_2$) is preferred as the oxygen source, and the silver oxide ($Ag_2O$) is not suitable as the oxygen source.

Figure 4:
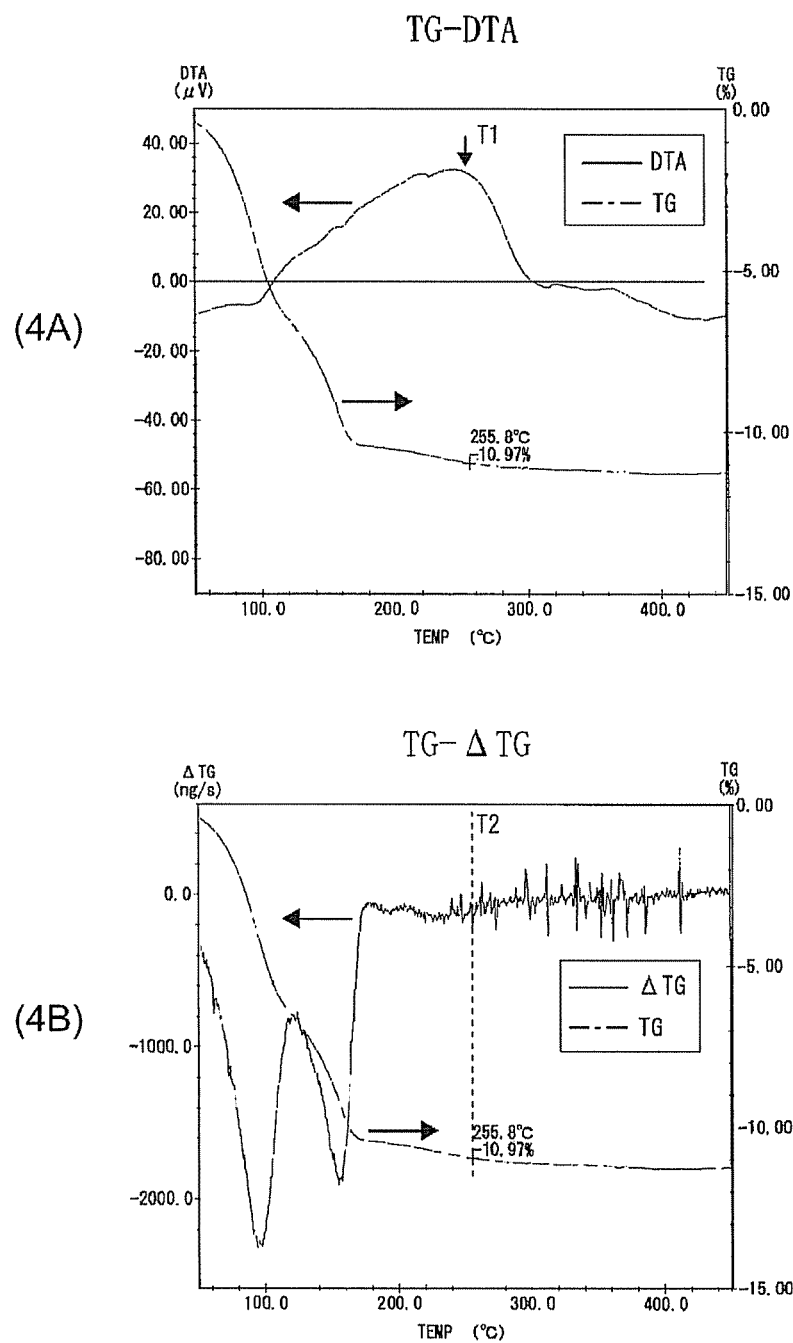
FIG. 4 is a diagram showing the thermal analysis of copper oxide addition paste concerning the present invention.

FIG. 4 is the graph diagram showing the thermal analysis spectra of the composite nanometal paste containing copper suboxide particles as the oxygen source concerning the present invention. In (4A) and (4B) of FIG. 4, it is shown examples of the pyrolysis under inert gas (nitrogen gas) as to the composite nanosilver paste which is adjusted by adding copper suboxide particles of 10 mass % to the compound nanosilver paste of 100 mass % before adding the oxygen source. The DTA spectrum of (4A) has the large peak (T1) corresponding to the oxidation process of said organic coating layer but the peak is gently sloping, so that it is shown that the oxygen supplying is caused in the wide temperature range. The peak temperature which are estimated from the TG and DTA spectra of (4A) and ΔTG of (4B) exists at comparatively lower temperature about 256° C., and it is considerable that this result is caused due to the effect of the oxygen source. Namely, (4B) shows the TG spectrum (broken line) and ΔTG, and the temperature of T2 at which the sintering is completed agrees with the temperature at which ΔTG becomes approximately zero.

Figure 5:
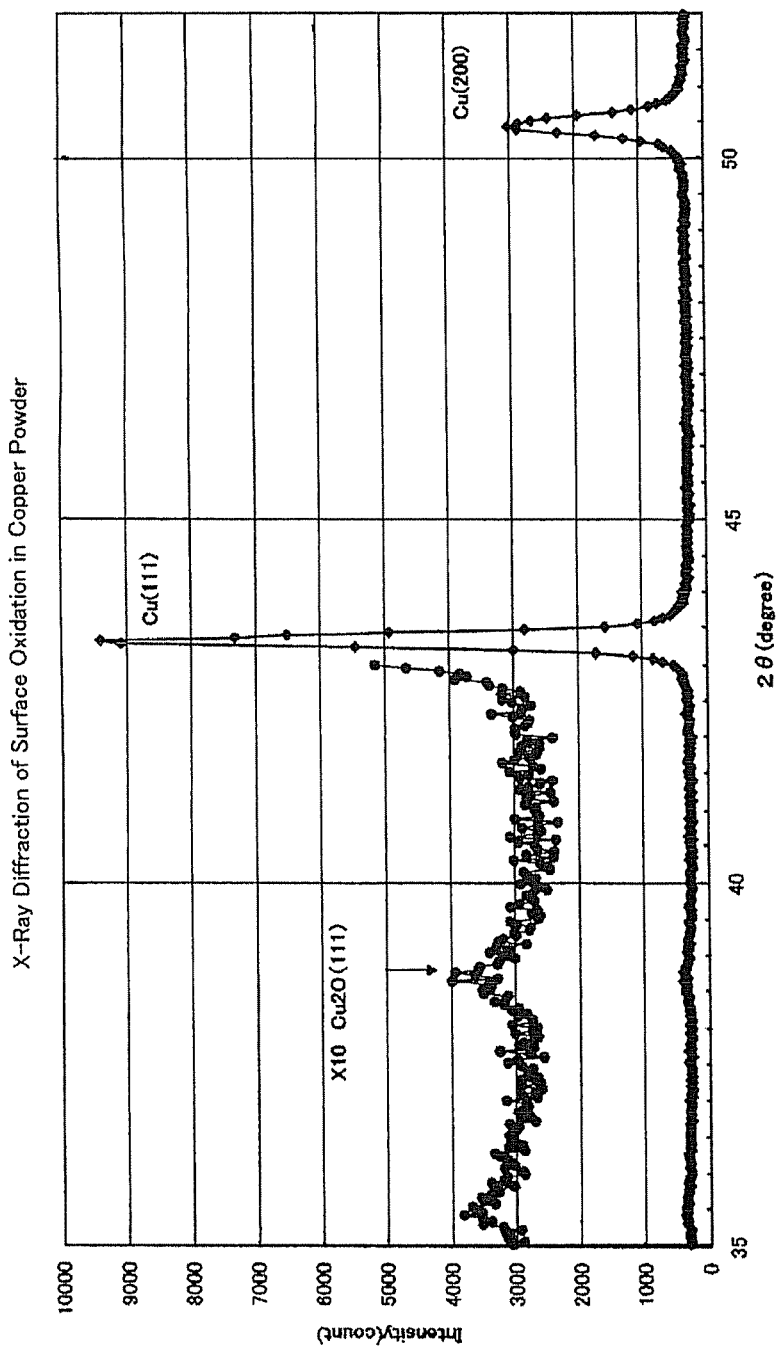
FIG. 5 is a graph diagram of X-ray diffraction spectrum showing that the surface oxidation state of the metal particle being an oxygen source concerning the present invention becomes copper suboxide.

FIG. 5 is the graph diagram of X-ray diffraction spectrum showing that the surface oxidation state of the metal particle which is the oxygen source concerning the present invention comprises copper suboxide. In the X-ray diffraction of FIG. 5, copper suboxide $Cu_2O$ is formed on the surface of copper particle, so that the surface oxidation metal particle is comprised. Thus, the surface oxidation metal particle in which the metallic oxide is formed on the surface of metal particle can be used as the oxygen source. The oxygen-containing copper filler shown in Table 1 comprises the surface oxidation metal particles and functions as oxygen source of the composite nanometal paste containing the oxygen source concerning the present invention. As shown in table 1, in the case of the sintering in the inert gas, the oxygen can be supplied in 50° C. to 200° C. and in the case of the sintering under coexistence with alcohol, the oxygen can be supplied in 120° C. to 280° C.

TABLE 2

Joinig Strength in the Case Containing Copper Filler Having the Surface Oxidation Layer

| Sample Number | Content of Copper Filler Having the Surface Oxidation Layer (mass %) | Oxygen Quantity (mass %) | Oxygen Quantity 300° C. (MPa) |
|---|---|---|---|
| #31 | 0 | 0 | 42.3 |
| #32 | 30 | 0.09 | 31.4 |
| #33 | 45 | 0.135 | 75.7 |
| #34 | 60 | 0.18 | 83.1 |
| #35 | 75 | 0.225 | 50.4 |

Table 2 shows the joining strength which is similarly measured by the shear strength in the case using the composite nanometal paste which is different from content of the copper filler having the surface oxidation layer, and the sample pieces of 5 mm φ×10 mm φ are jointed by heating and pressurizing during 3 minutes. In the pressurization sintering, the weight is 40 MPa, and the sintering temperature is 300° C. The average particle diameter of the copper filler is 1.5 μm, and the content of the copper filler in the composite nanometal paste containing the copper filler increases from 0 mass % to 75 mass %. Namely, the samples #31 and #32 are comparative examples, and the samples #33 to #35 are embodiments of the present invention. In each sample, the mass ratio adding both the composite nanosilver particle and the copper filler is 90 mass % per the paste of 100 mass %.

In the analysis data of copper filler having the surface oxidation layer, it is found that the content of the oxygen quantity contained in the metallic oxide which is formed on the surface is about 0.3 mass %. The surface oxidation layer indicates the oxidation layer such as copper suboxides formed on the surface rather than the surface absorption state of the oxygen. In the pressurization joining, the oxygen supplying is cut, so that it is possible to evaluate whether they become the oxygen source in view of the pressurization joining strength of the composite nanometal paste (also called simply "paste"). In the Table 2, since the oxygen quantity contained in the copper filler is about 0.3 mass %, the oxygen quantity (mass %) is values that the content of the copper filler is multiplied by 0.003. Therefore, the oxygen quantity which can be supplied increases with increasing of the copper filler content in the paste.

In the case of the paste in which the oxygen quantity is a little, since the joining strength is weaker than the paste not to be added and increases for more than 0.135 mass %, it is found that the oxygen contained in metal filler also is functioned as the oxygen source. In the case that the oxygen content of the copper powder (called also "copper filler") is preferred, the joining strength becomes more than 70 MPa, and in the case of being optimum, its value becomes more than 80 MPa. In addition, when the oxygen content becomes more than 0.225 mass %, the content of copper filler is excessive in the paste, so that the content of composite nanosilver particle which becomes the binder material decreases and the joining strength decreases. In the samples #33 to 35, the contents of composite nanosilver particle are 45 mass %, 30 mass % and 15 mass % per all mass of the paste, respectively. Therefore, when the composite nanosilver particle is 100 mass %, the mass ratios (mass %) of oxygen in the samples #33 to 35 are 0.3 mass %, 0.6 mass % and 1.5 mass %, respectively Namely, as result of Table 2, the joining strength increases in the range of at least about 0.3 to 2 mass %.

TABLE 3

Joining Strength in the Case Adding Silver Carbonate as Oxygen Source

| Sample Number | Addition Quantity of the Oxygen Source (mass %) | Oxygen Quantity (mass %) | Effective Emperature range (° C.) | Joining Strength 250° C. (MPa) | Joining Strength 300° C. (MPa) | Joining Strength 350° C. (MPa) |
|---|---|---|---|---|---|---|
| #1 | 0 | 0 | — | 20.7 | 40.9 | 53.5 |
| #2 | 0.03 | 0.0048 | 160-260 | 27.9 | 51.4 | 74.0 |
| #3 | 0.66 | 0.11 | 160-260 | 49.8 | 66.2 | 68.4 |
| #4 | 1.1 | 0.18 | 160-260 | 71.9 | 71.6 | 72.0 |
| #5 | 1.9 | 0.3 | 160-260 | 59.5 | 68.2 | 93.9 |
| #6 | 3.4 | 0.54 | 160-260 | 37.1 | 44.7 | 65.4 |
| #7 | 1.9 | 0.3 | 160-260 | 42.8 | 45.7 | — |

In Table 3, it is shown that the joining strength of joined members which is jointed by using the composite nanosilver paste for joining is measured, where the silver carbonate $Ag_2O_3$ is added as the oxygen source in the paste. The sample #1 is a comparative example, and the oxygen source is not added in the sample #1. The sample number #2 to 7 are an embodiment of the present invention, and there is shown the result that the joining strength of the composition nanosilver paste for joining is measured, where the silver carbonate is added as the oxygen source. When all mass of the compound nanosilver paste is assumed to be 100 mass %, the composite nanosilver particle in which the organic coating layer derived from hexanol is formed around the silver core is 30 mass %, and there are contained the silver filler of 60 mass %, isobornyl cyclohexanol (Terusolve MTPH, made by Nippon Terpene Chemicals, Inc.) of 5 mass % as the viscosity grant agent and octanol of 5 mass % as the viscosity adjustment solvent. Furthermore, for the composite nanosilver paste for joining of 100 mass %, the sample numbers #2 to 6 contain the silver carbonates of 0.03 mass %, 0.66 mass %, 1.1 mass %, 1.9 mass % and 3.4 mass % as the oxygen source, respectively. Furthermore, in Table 3, the mass ratio (mass %) of the oxygen contained in the oxygen source (called "oxygen quantity (mass %)" as follow) is shown in the case regarding the composite nanosilver paste for joining as 100 mass % before being added. The oxygen quantity (mass %) shows the maximum mass ratio of oxygen which can be released from the silver carbonate of the oxygen source, and does not show the oxygen quantity (mass %) which can be really released. However, it is considered that the released oxygen quantity (mass %) depends upon the content mass ratio of the silver carbonate, so that the released oxygen quantity increases in the order of samples #2 to 6. In addition, the effective temperature range is the temperature range in which the oxygen source can supply the oxygen.

As shown in Table 3, in the samples #2 to 4, the joining strength increases with increasing of the silver carbonate content in comparison with the sample #1. In the measurement of joining strength, the jointed members is obtained by applying the test piece in which joining area corresponds to 5 mm φ as well as examination described above. This jointed members is pressurized at 40 MPa and is simultaneously heated at 250° C., 300° C. or 350° C. for three minutes. In the case of any one of the joining temperatures, the joining strength increases with addition of the silver carbonate. Furthermore, the sample #7 is jointed by heating for three minutes at 250° C. or 300° C. in non-pressurization by using the same sample piece as the sample #5. In non-pressurization, the joining strength of sample number #1 which is the comparative example also increases, so that it is found that the oxygen source is effective.

Figure 6:
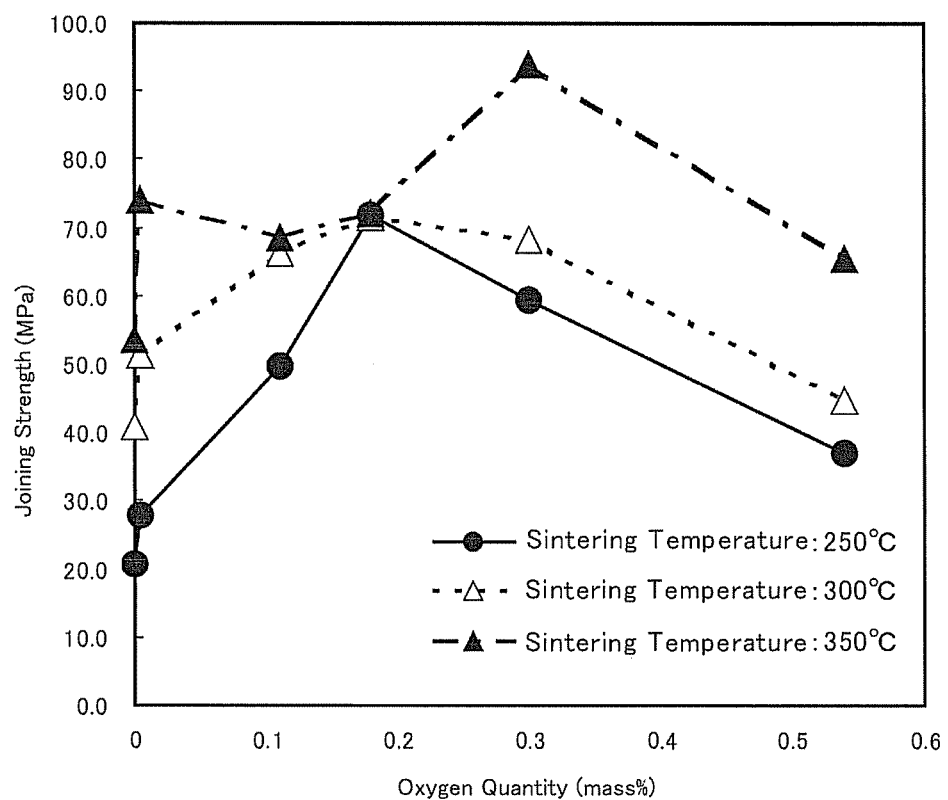
FIG. 6 is a graph diagram in which the joining strength of the composition nanosilver paste for joining concerning the present invention is plotted for the quantity of oxygen (mass %) in the oxygen source.

FIG. 6 is the graph diagram in which the joining strength of composite nanosilver paste for joining concerning the present invention is plotted with respect to the oxygen quantity of the oxygen source (mass %). In all cases of sintering temperatures, when the oxygen quantity (mass %) increases, the joining strength tends to increase. However, when the oxygen quantity of the sample #6 becomes about 0.54 mass %, the joining strength nears the joining strength of the sample #2 which the oxygen quantity (mass %) is least. It is considered that the supplied oxygen becomes excessive. As shown in FIG. 6, when the joining strength begins to decrease, the slope is 90-120 MPa/mass %, and in the case of the sintering temperature 250° C. at which the joining strength decreases most gently, the joining strength becomes the same degree as thing not to add the silver carbonate by the increasing of about 0.3 mass %. For the composite nanosilver particle of 100 mass %, the oxygen quantity (mass %) of the samples #2 to 6 becomes about 0.016 mass % to 1.8 mass %. It is shown that the joining strength increases rapidly by a little addition of the silver carbonate, so that it is preferable that the oxygen quantity of the oxygen source (mass %) is 0.01 mass % to 2 mass % per the composite silver nanoparticle of 100 mass %.

Furthermore, in the case including the oxygen-containing compound such as the silver carbonate and the silver peroxide as the oxygen source, it is possible to contain the silver filler comprising the silver particles, and since the sintered body is formed from the silver ingredient, the preferred joining strength and the electrical conductivity can be given.

TABLE 4

Joining Strength in the Case Adding the Surface Oxidation Copper Powder as Oxygen Source

| Sample Number | Addition Quantity of the Oxygen Source (mass %) | Oxygen Quantity (mass %) | Effective Temperature Range (° C.) | Joining Strength 350° C. (MPa) |
|---|---|---|---|---|
| #8 | 2 | 0.006 | 160-260 | 71.6 |
| #9 | 5 | 0.015 | 160-260 | 63.1 |
| #10 | 10 | 0.032 | 160-260 | 52.5 |
| #11 | 20 | 0.061 | 160-260 | 28.1 |

Table 4 shows the joining strength of the samples adding the addition quantity (mass %) of the surface oxidation copper powder in which the surface oxidation layer comprising copper suboxide is formed in the case that the content of composite nanosilver paste for joining is set to 100 mass % before adding the oxygen source. When all mass of the compound nanosilver paste which does not contains the surface oxidation copper powder is set to 100 mass %, there are contained the composite nanosilver particles of 30 mass %, the copper filler of 60 mass %, isobornyl cyclohexanol (Terusolve MTPH, made by Nippon Terpene Chemicals, Inc.) of 5 mass % as the viscosity grant agent and octanol of 5 mass % as the viscosity adjustment solvent, and in the composite nanosilver particles, the organic coating layer deriving from hexanol is formed around the silver core. Measuring method of joining strength is the same as table 3. In comparison with the sample #3 of the comparative example shown in the table 3, the samples #8 to #10 have the preferred joining strength. However, in the sample #11, when the addition quantity of surface copper oxide powder becomes 20 mass %, the joining strength falls in comparison with sample #1 of table 3.

In addition, even if the quantity adding surface copper oxide powder is 20 mass %, it is possible to increase the joining strength due to improving dispersibility of the surface oxidation copper powder.

Figure 7:
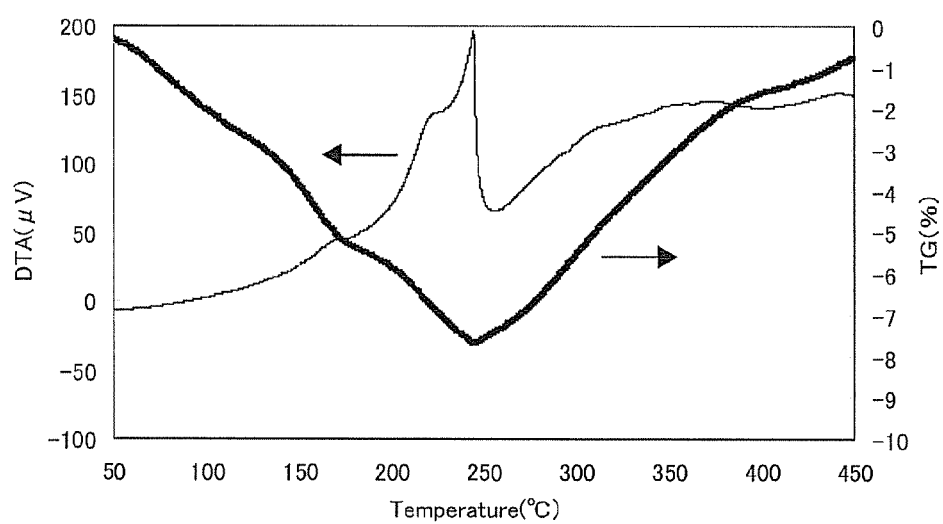
FIG. 7 is a graph diagram showing TG·DTA of the sample in which the powder of the surface oxidation copper is excessively added like the sample number #10 of table 3 as the comparative example of the present invention.

FIG. 7 is the comparative example of the present invention alike the sample #10 of Table 3, and is graph diagram showing TG/DTA that the surface oxidation copper powder is added excessively. The thin line shows values of DTA (μ, V), and the bold line shows values of TG (%). Namely, when the oxygen source is added excessively, an unusualness result that TG (%) increases is shown, and DTA (μ, V) also is positive values, so that the exothermic is shown. It is considered that the copper is excessively oxidized in the high temperature side after sintering by the excessive oxygen.

Therefore, in table 4, the oxygen quantity (mass %) of the oxygen source is about 0.02 mass % to 0.1 mass % to the composite nano silver particle of 100 mass %.

TABLE 5

Relation both Content of Oxygen Source and Joining Strength

| Sample Number | Addition Quantity of the Oxygen Source (mass %) | Oxygen Quantity (mass %) | Joining Strength 250° C. (MPa) |
|---|---|---|---|
| #8 | Oxygen Source: Nothing | — | 21.1 |
| #9 | Oxygen Source: Ag$_2$O 0.25mass % | 0.015 | 17.3 |
| #10 | Oxygen Source: Ag$_2$O 0.25mass % | 0.032 | 34.5 |

Table 5 shows measured results of the joining strengths in the sample #13 of the embodiment concerning the present invention and the samples #11 and #12 of comparative examples, and the silver peroxide is contained as the oxygen source. When all mass of the composite nanosilver paste which does not contains the oxygen source is set to 100 mass %, there are contained the composite nanosilver particle of 30 mass %, the copper filler of 60 mass %, isobornyl cyclohexanol (Terusolve MTPH, made by Nippon Terpene Chemicals, Inc.) of 5 mass % as the viscosity grant agent and 5 mass % of octanol as the viscosity adjustment solvent, and in the composite nanosilver particle, the organic coating layer deriving from hexanol is formed around the silver core. In both the silver oxide of sample #12 and the silver peroxide of sample #13, the pyrolysis temperature under the atmosphere is higher than 400° C. but they can be reduced at 110° C. to 140° C. in alcohol. In the paste containing an alcohol solvent, the oxygen is released at 110° C. as for the case of the silver oxide of sample #12 (comparative example) and is released in 122 to 170° C. as for the case of the silver peroxide of sample #13 (embodiment), and the DTA spectrum which is not shown changes to negative but the temperature range for the silver oxide is lower than desorption temperature range of the coating, so that the silver oxide does not contribute to the oxidation and the resolution in the coating. However, the oxygen releasing in the silver peroxide of sample #13 is twice, and in the case researching at least the joining strength, the strength increases at low temperature, it is effective to be used as the oxygen source. As shown in table 5, the silver peroxide of sample #13 (embodiment) functions as the oxygen source, in comparison with a comparative example of sample number #11, the joining strength increase clearly. Namely, it is necessary that the temperature range at the time that the oxygen of metallic oxide is released exist within the temperature range that the coating is desorbed.

Table 6 shows the result that the joining strengths are measured by changing the pressurization timing temperature in the pressurization joining for which the composite nanosilver paste containing the oxygen source concerning to the present invention is used. The sample #5 is used as the composite nanosilver paste containing the oxygen source, and the composite nanosilver particle and the silver carbonate fine particle of which the diameter is tens of nanometer are contained as the oxygen source, similarly, the viscosity grant agent and the viscosity adjustment solvent are added. The sample pieces for joining are an oxygen free copper pieces which are pieces of diameters 5 mm ϕ 2 mm t and 10 mm ϕ 5 mm t. When the pyrolysis temperature range of the organic coating layer in the composite nanosilver paste is regarded as 160 to 280° C., the pressurization is started in the pyrolysis temperature range. In the pyrolysis temperature range, most of the viscosity grant agent and the viscosity adjustment solvent disappear, and the organic coating layer is resolved by the oxygen supplied from the oxygen source, so that the fusion and the sintering of the nanosilver particle progress. Each of pressurization timing temperature is 180° C., 225° C. or 250° C. In addition, the sintering temperature is 300° C., and the raising rate of temperature is constant for 30 seconds during heating to 300° C. Therefore, the pressurization timing is variously changed until arriving to 300° C. The pressures of pressurization in the samples #21 to #23 are 5 MPa, the pressures of pressurization in the samples #24 to 26 are 10 MPa, and the pressures of pressurization in the samples #27 to 29 are 20 MPa. In each pressure, when the pressurization temperature is changed to 180° C., 225° C. and 250° C., the joining strength is measured. In the case that the pressure of the pressurization is 5 MPa, the joining strength becomes strong by the pressurization timing at 180° C. in the temperature side, in the case that the pressure of the pressurization is 10 MPa, the joining strength becomes strong by the pressurization timing at 225° C. in the middle temperature, and in the case that the pressure of the pressurization is 20 MPa, the joining strength becomes strong by the pressurization timing at 225° C. in the middle temperature.

For the case of the pressurization joining mentioned above, the pressurization is performed at 40 MPa of the relatively large value but the relatively preferable joining strength is obtained by selecting the pressurization timing for the pressurization of a relatively little value less than 20 MPa due to the pressurization in the pyrolysis temperature range. In particular, since the oxygen contributing to the pyrolysis is released from the oxygen source in the pyrolysis

TABLE 6

Joining Strength of Samples Pressurized at Deferent Temperature in the Pyrolysis Temperature Range during Pressurization Joining

| Sample Number | Temperature of Heater (° C.) | Diameter of Test Piece (mm) | Weight (N) | Pressures of Pressurization (MPa) | Pressurization Temperature (° C.) | Joining Strength (MPa) |
|---|---|---|---|---|---|---|
| #21 | 300 | 5ø | 100 | 5 | 180 | 28.7 |
| #22 | 300 | 5ø | 100 | 5 | 225 | 22.7 |
| #23 | 300 | 5ø | 100 | 5 | 250 | 12.8 |
| #24 | 300 | 5ø | 200 | 10 | 180 | 37.7 |
| #25 | 300 | 5ø | 200 | 10 | 225 | 39.3 |
| #26 | 300 | 5ø | 200 | 10 | 250 | 20.9 |
| #27 | 300 | 5ø | 400 | 20 | 180 | 40.1 |
| #28 | 300 | 5ø | 400 | 20 | 225 | 60.9 |
| #29 | 300 | 5ø | 400 | 20 | 250 | 34.3 | temperature range, the pyrolysis of the organic coating layer and the sintering of the pressurization can be performed with high efficiency Furthermore, in the pressurization joining using the composite nanosilver paste containing the oxygen source concerning the present invention, even if the pressurization temperature exists at lower temperature side than the pyrolysis temperature range, the joining can be performed but it is preferred to be pressurized. If the heating temperature is in the vicinity of the pyrolysis temperature range, the joining can be performed in the high temperature side. In addition, the values of the pressurization (pressurization pressure) in the Table 6 is constantly held at 5 MPa, 10 MPa and 20 MPa, but in the case that the paste viscosity is small, it is preferable to increase the values of the pressurization gradually from a small value at first so that the preferable pressurization is performed to avoid the pushing of the paste due to the pressurization.

Furthermore, in the embodiment shown in the Table 6, the pressurization is performed at three points of the pyrolysis temperature range (the pressurization temperature: 180° C., 225° C., 250° C.). However, in the pyrolysis temperature range, when the pressurization is started at the setting pressure or the pressure reaches to the setting pressure, it is possible to increase the joining strength. In addition, even if the setting pressure can be applied in the higher temperature side than pyrolysis temperature range, the joining strength can increase.

INDUSTRIAL APPLICABILITY

According to the present invention, since the composite nanometal paste contains the oxygen source, in the joining and the sintering under inert gas, the organic coating layer of the composite nanometal particle can be removed in higher efficiency due to the pyrolysis, and it is possible to improve the joining strength and the electrical conductivity of the sintering body that the composite nanometal paste is sintered. The composite nanometal paste containing the oxygen source can be sintered at comparatively low temperature in a short time, and in addition to the high strength and the high electrical conductivity, the preferable heat conductivity can be given, so that it is possible to be used as the joining material in the power semiconductors.

The invention claimed is:

1. An oxygen source-containing composite nanometal paste comprising at least composite nanometal particles in which an organic coating layer is formed around a submicron or smaller silver core, and an oxygen source for feeding oxygen contributing to pyrolysis at a pyrolysis temperature range in which said organic coating layer is pyrolyzed, wherein said oxygen source comprises an oxygen-containing metal compound, wherein said oxygen-containing metal compound comprises one or more members selected from the group consisting of silver peroxide and copper suboxide, and wherein the oxygen content of said oxygen source exists within a range of 0.01 mass % to 2 mass % per 100 mass % of said composite nanometal particles.

2. An oxygen source-containing composite nanometal paste comprising at least composite nanometal particles in which an organic coating layer is formed around a submicron or smaller silver core, a metal filler, and an oxygen source for feeding oxygen contributing to pyrolysis at a pyrolysis temperature range in which said organic coating layer is pyrolyzed, wherein said oxygen source comprises a surface oxidation layer which is formed on a surface of said metal filler, wherein said surface oxidation layer comprises copper suboxide, and wherein the oxygen content of said oxygen source exists within a range of 0.02 mass % to 2 mass % per 100 mass % of said composite nanometal particles.

3. The oxygen source-containing composite nanometal paste according to claim 1 or 2, wherein said oxygen source feeds said oxygen within a range of 160° C. to 300° C.

4. The oxygen source-containing composite nanometal paste according to claim 1 or 2, wherein said organic coating layer comprises one or more members selected from an alcohol, an alcohol derivative and a carboxylic acid.

5. The oxygen source-containing composite nanometal paste according to claim 1, wherein said oxygen source contains a composite body that a periphery of said oxygen-containing metal compound is coated by said composite nanometal particles, and said composite body feeds said oxygen within said pyrolysis temperature range.

6. The oxygen source-containing composite nanometal paste according to claim 1, wherein said oxygen source-containing composite nanometal paste is used in a joining method, wherein the joining method comprises the steps of setting a sintering temperature higher than said pyrolysis temperature range of said organic coating layer, and heating to said sintering temperature; and a pressurization is carried out by applying a setting pressure during a timing that the temperature reaches within said pyrolysis temperature range.

7. The oxygen source-containing composite nanometal paste according to claim 2, wherein said oxygen source-containing composite nanometal paste is used in a joining method, wherein the joining method comprises the steps of setting a sintering temperature higher than said pyrolysis temperature range of said organic coating layer, and heating to said sintering temperature; and a pressurization is carried out by applying a setting pressure during a timing that the temperature reaches within said pyrolysis temperature range.

* * * * *